(12) United States Patent
Nakamura

(10) Patent No.: US 8,790,949 B2
(45) Date of Patent: Jul. 29, 2014

(54) SOLID STATE IMAGING DEVICE, METHOD OF PRODUCING SOLID STATE IMAGING DEVICE, AND ELECTRONIC APPARATUS

(71) Applicant: Sony Corporation, Tokyo (JP)

(72) Inventor: Ryosuke Nakamura, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 14/105,917

(22) Filed: Dec. 13, 2013

(65) Prior Publication Data

US 2014/0106495 A1 Apr. 17, 2014

Related U.S. Application Data

(62) Division of application No. 13/406,706, filed on Feb. 28, 2012, now Pat. No. 8,648,362.

(30) Foreign Application Priority Data

Mar. 23, 2011 (JP) ................................. 2011-063974

(51) Int. Cl.
*H01L 21/02* (2006.01)

(52) U.S. Cl.
USPC .. 438/62; 438/67; 257/E27.133; 257/E31.032

(58) Field of Classification Search
USPC .................. 438/60–70; 257/E27.133, 31.032
See application file for complete search history.

(56) References Cited

U.S. PATENT DOCUMENTS 6,639,293 B2 * 10/2003 Furumiya et al. ............. 257/462

* cited by examiner

*Primary Examiner* — Michael Lebentritt
(74) *Attorney, Agent, or Firm* — Sheridan Ross P.C.

(57) ABSTRACT

A solid state imaging device includes: a substrate; a photoelectric conversion unit that is formed on the substrate to generate and accumulate signal charges according to light quantity of incident light; a vertical transmission gate electrode that is formed to be embedded in a groove portion formed in a depth direction from one side face of the substrate according to a depth of the photoelectric conversion unit; and an overflow path that is formed on a bottom portion of the transmission gate to overflow the signal charges accumulated in the photoelectric conversion unit.

4 Claims, 12 Drawing Sheets

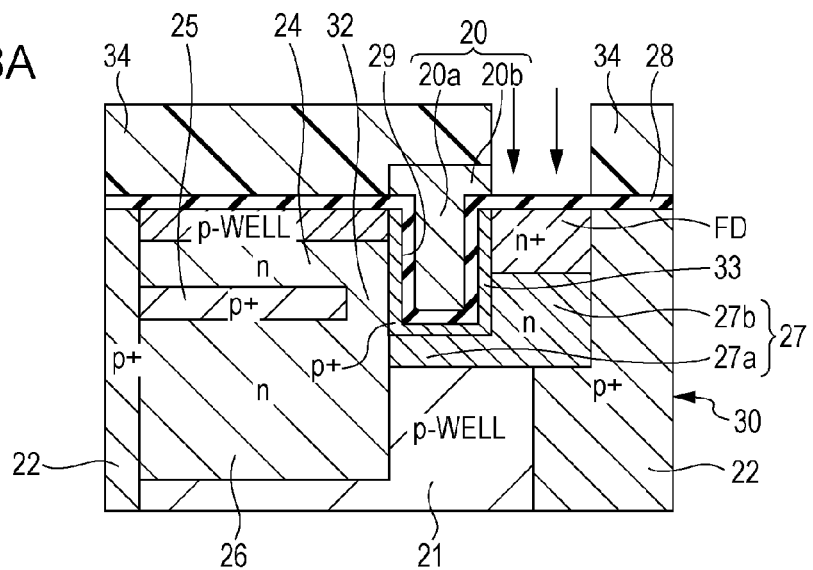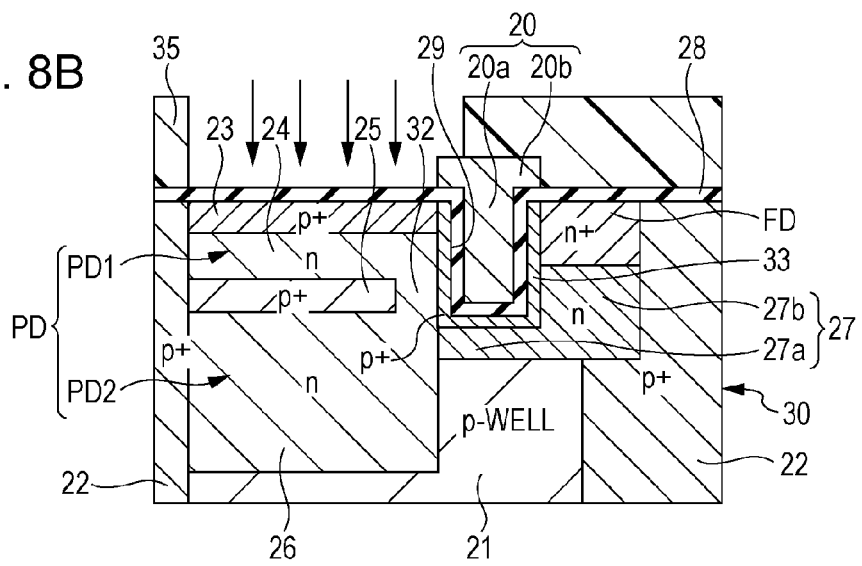

SOLID STATE IMAGING DEVICE, METHOD OF PRODUCING SOLID STATE IMAGING DEVICE, AND ELECTRONIC APPARATUS

CROSS-REFERENCE TO RELATED APPLICATIONS

This application is a divisional of U.S. patent application Ser. No. 13/406,706, filed Feb. 28, 2012, which claims priority to Japanese Patent Application Serial No. JP 2011-063974, filed in the Japan Patent Office on Mar. 23, 2011, the entire disclosures of which are hereby incorporated herein by reference.

BACKGROUND

The present disclosure relates to a solid state imaging device having vertical transistors, a method of producing the same, and an electronic apparatus provided with the solid state imaging device.

Solid state imaging devices are classified into either amplification solid state imaging devices represented by devices such as a CMOS (Complementary Metal Oxide Semiconductor) image sensor, or charge transmission solid state imaging devices represented by devices such as a CCD (Charge Coupled Device) image sensor. The solid state imaging device is widely used in digital still cameras, digital video cameras, and the like. Recently, because of their lower power supply voltage and low power consumption, the CMOS image sensor is widely used as a solid state imaging device mounted on mobile apparatuses such as mobile phones provided with cameras and a PDAs (Personal Digital Assistants).

Recently, as described in Japanese Unexamined Patent Application Publication No. 2010-114274, a CMOS solid state imaging device having a plurality of photodiodes formed in a depth direction of a semiconductor substrate and having a reduced pixel size is proposed. The photodiodes formed in the depth direction have a transmission channel in a vertical direction with respect to the semiconductor substrate, and are provided with a transmission transistor formed of a vertical transmission gate electrode.

SUMMARY

With respect to a backside illumination solid state imaging device or a surface solid state imaging device configured using a P-type semiconductor substrate, it is difficult to discharge signal charges generated over a saturation charge amount of a photodiode to the opposite side to the light incident face side of the substrate. For this reason, in such a solid state imaging device, a lateral overflow structure of overflowing the signal charges over the saturation charge amount of the photodiode by floating diffusion is employed. In the solid state imaging device provided with the vertical transmission transistor described in Japanese Unexamined Patent Application Publication No. 2010-114274, the signal charges over the saturation charge amount flow in a transmission channel of the transmission transistor and are discharged by the floating diffusion, by intense light.

As described in Japanese Unexamined Patent Application Publication No. 2010-114274, in the configuration in which the overflowing signal charges pass through the transmission channel of the vertical transmission transistor, the signal charges passes through a lateral portion of the vertical gate electrode formed on the substrate by engraving. For this reason, when there is variation in the shape or formation position of the vertical gate electrode, the path of the overflowing signal charges is changed, and thus a gap of the saturation charge amount may occur, a dynamic range may be reduced, and a yield may decrease. In such a structure, the transmission path at the time of transmitting the signal charges and the path of the overflowing are substantially the same, and the design may become difficult.

In the solid state imaging device provided with the vertical transmission transistor, it is desirable to provide a solid state imaging device in which variation of a saturation charge amount is reduced and a yield is improved. It is desirable to provide an electronic apparatus using the solid state imaging device.

According to an embodiment of the present disclosure, there is provided a solid state imaging device including: a substrate; a photoelectric conversion unit that is formed on the substrate to generate and accumulate signal charges according to light quantity of incident light; a vertical transmission gate electrode that is formed to be embedded in a groove portion formed in a depth direction from one face side of the substrate according to a depth of the photoelectric conversion unit; and an overflow path that is formed on a lower portion of the transmission gate to overflow the signal charges accumulated in the photoelectric conversion unit.

In the solid state imaging device of the embodiment of the present disclosure, the overflow path is formed to pass through the bottom portion of the vertical transmission gate electrode, and thus it is possible to design the general transmission path of the signal charges and the path of overflowing the signal charges separately.

According to another embodiment of the present disclosure, there is provided a method of producing a solid state imaging device including: forming a photoelectric conversion unit formed of a photodiode, on a substrate; forming an overflow path formed of a second conductive semiconductor area in a depth connectable to the second conductive semiconductor area that is a charge accumulation area of the photoelectric conversion unit in an area adjacent to an area of the substrate in which the photoelectric conversion unit is formed; forming a groove portion at an upper portion of the second conductive semiconductor area that is the overflow path, adjacent to the photoelectric conversion unit; forming a vertical transmission gate electrode by embedding an electronic material through a gate insulating film in the groove portion; and forming a floating diffusion area formed of the second conductive semiconductor area and connected to the second conductive semiconductor area that is the overflow path in an area adjacent to the transmission gate electrode.

In the method of producing the solid state imaging device according to the embodiment of the present disclosure, the overflow path is formed before forming the groove portion. It is possible to simultaneously form the overflow path positioned at the bottom portion of the transmission gate and the overflow path positioned at the lower layer of the floating diffusion area.

According to still another embodiment of the present disclosure, there is provided a method of producing a solid state imaging device including: forming a photoelectric conversion unit formed of a photodiode, on a substrate; forming a mask having an opening portion communicating with a desirable area adjacent to an area of the substrate in which the photoelectric conversion unit is formed, on the substrate, and performing etching through the mask to form a groove portion with a desirable depth; forming a second conductive semiconductor area that is an overflow path in self alignment by ion injection of second conductive impurities through the mask; forming a vertical transmission gate electrode by embedding an electrode material through a gate insulating film in the groove portion; and forming a floating diffusion area formed of the second conductive semiconductor area in an area adjacent to the transmission gate electrode to be connected to the overflow path.

In the method of producing the solid state imaging device according to the embodiment of the present disclosure, the first second-conductive semiconductor area that is the overflow path is formed by the same mask as the mask for forming the groove portion. Accordingly, the first second-conductive semiconductor area that is the overflow path is formed at the bottom portion of the transmission gate electrode by self alignment.

According to a still another embodiment of the present disclosure, there is provided an electronic apparatus including: an optical lens; a solid state imaging device to which light collected in the optical lens is input; and a signal processing circuit that processes an output signal of the solid state imaging device.

In the electronic apparatus according to the embodiment of the present disclosure, in the solid state imaging device, the overflow path is formed at the bottom portion of the transmission gate electrode, and thus it is possible to separately design the general transmission path of the signal charges and the path of overflowing the signal charges. Accordingly, image quality is improved.

According to the present disclosure, in the solid state imaging device provided with the vertical transmission transistor, the variation of the saturation charge amount is reduced, and the yield is improved.

BRIEF DESCRIPTION OF THE DRAWINGS

FIG. 8A and FIG. 8B are diagrams illustrating a process of producing the solid state imaging device according to the first embodiment of the present disclosure.

DETAILED DESCRIPTION OF EMBODIMENTS

Hereinafter, a solid state imaging device according to an embodiment of the present disclosure, a method of producing the solid state imaging device, and an example of an electronic apparatus will be described with reference to FIG. 1 to FIG. 15. The present disclosure is not limited to the following example.

Figure 1:
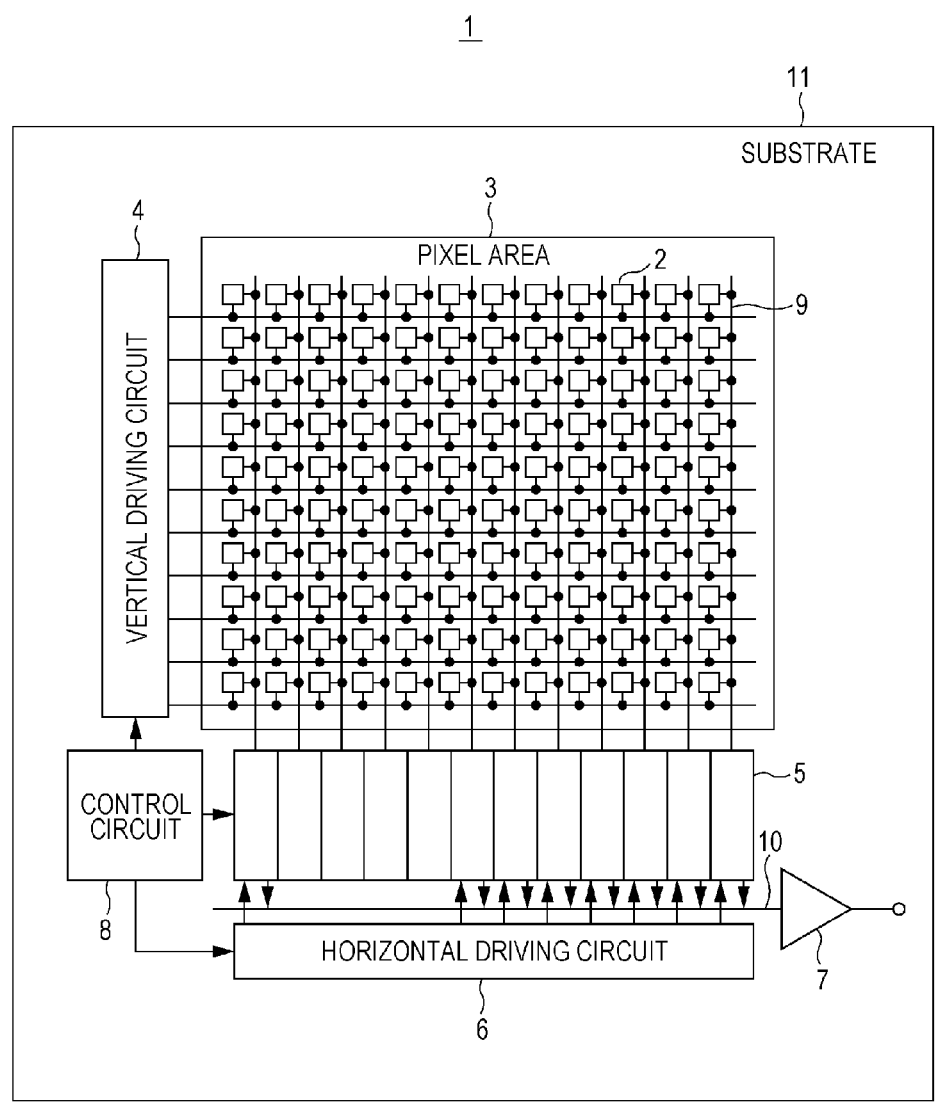
FIG. 1 is a diagram illustrating an overall configuration of a solid state imaging device according to a first embodiment of the present disclosure.

1. First Embodiment: Solid State Imaging Device
1-1. Overall Configuration of Solid State Imaging Device
1-2. Configuration of Main Part
1-3. Production Method
1-4. Operation
1-5. Modified Example 1
1-6. Modified Example 2
2. Second Embodiment: Method of Producing Solid State Imaging Device
3. Third Embodiment: Method of Producing Solid State Imaging Device
4. Fourth Embodiment: Solid State Imaging Device
5. Fifth Embodiment: Electronic Apparatus 1. First Embodiment Solid State Imaging Device 1-1. Overall Configuration of Solid State Imaging Device FIG. 1 is a schematic diagram illustrating an overall configuration of a CMOS solid state imaging device according to a first embodiment of the present disclosure.

The solid state imaging device 1 of the embodiment includes a pixel area 3 formed of a plurality of pixels 2 arranged on a substrate 11 formed of silicon, a vertical driving circuit 4, a column signal processing circuit 5, a horizontal driving circuit 6, an output circuit 7, and a control circuit 8.

The pixel 2 is formed of a photoelectric conversion unit formed of a photodiode and a plurality of pixel transistor, and the plurality of pixels 2 are regularly arranged on the substrate 11 in a 2-dimensional array. The pixel transistors constituting the pixel 2 may be four MOS transistors including a transmission transistor, a reset transistor, a selection transistor, and an amplification transistor, and may be three transistors excluding the selection transistor.

The pixel area 3 is formed of the pixels 2 regularly arranged in the 2-dimensional array. The pixel area 3 is formed of an effective pixel area in which light is actually received and signal charges generated by photoelectric conversion are amplified and read by the column signal processing circuit 5, and a black standard area (not shown) for outputting optical black that is a standard black level. Generally, the black standard area is formed at an outer peripheral portion of the effective pixel area.

The control circuit 8 generates a clock signal and a control signal that are standards of operations of the vertical driving circuit 4, the column signal processing circuit 5, and the horizontal driving circuit 6 on the basis of a vertical synchronization signal, a horizontal synchronization signal, and a master clock. The clock signal and the control signal generated by the control circuit 8 are input to the vertical driving circuit 4, the column signal processing circuit 5, and the horizontal driving circuit 6.

For example, the vertical driving circuit 4 is formed of a shift register, and selectively and sequentially scans the pixels 2 in the pixel area 3 for each row. The pixel signals based on the signal charges generated according to the light reception quantity of the photodiodes of the pixels 2 are supplied to the column signal processing circuit 5 through the vertical signal lines.

The column signal processing circuits 5 are provided, for example, for each column, and process a signal process such as noise removal and signal amplification on signals output from the pixels 2 of one row by signals from the black standard pixel area (although not shown, it is formed around the effective pixel area) for each pixel 2 row. The output terminal of the column signal processing circuit 5 is provided, and a horizontal selection switch (not shown) is provided between the column signal processing unit and the horizontal signal line 10.

The horizontal driving circuit 6 is formed of, for example, a shift register, that sequentially outputs a horizontal scanning pulse to select each of the column signal processing circuits 5, and outputs the pixel signal from each of the column signal processing circuit 5 to the horizontal signal line 10.

The output circuit 7 performs a signal process on the signals sequentially supplied from each of the column signal processing circuits 5 through the horizontal signal line 10, and outputs the signals.

1-2. Configuration of Main Part

Figure 2:
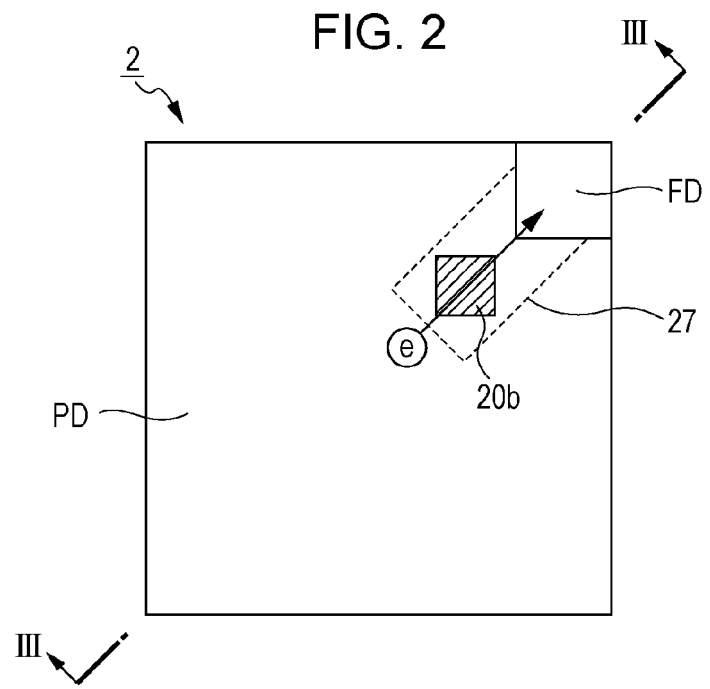
FIG. 2 is a diagram illustrating a plan configuration of an area including a photodiode and a transmission transistor Tr in a single pixel of the solid state imaging device according to the first embodiment of the present disclosure.
Figure 3:
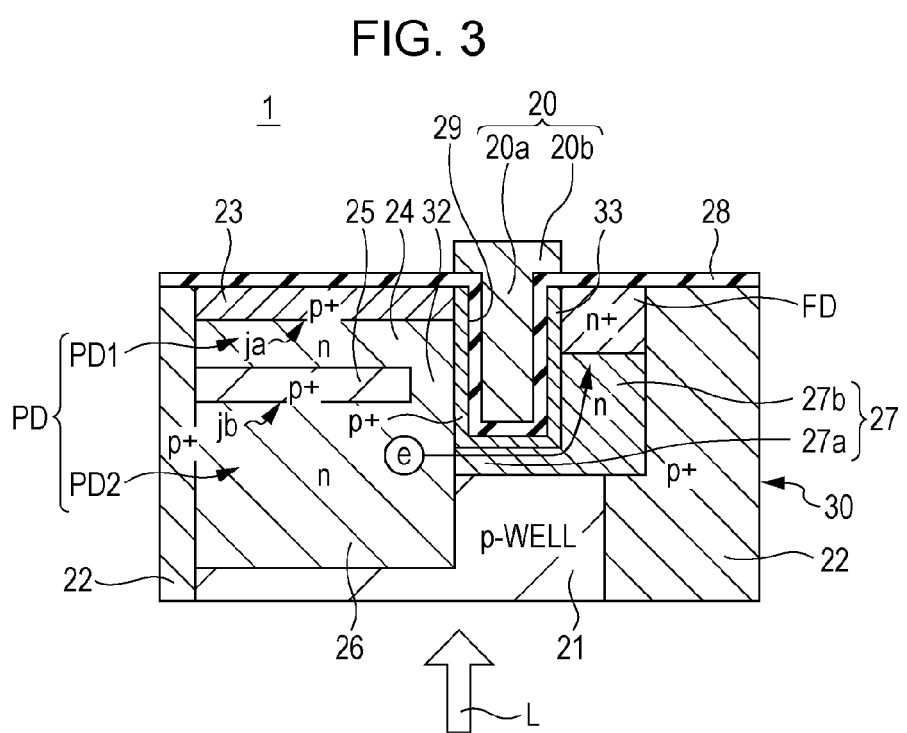
FIG. 3 is a diagram illustrating a cross-sectional configuration taken along the line III-III shown in FIG. 2.

FIG. 2 shows a plan configuration of an area including a photodiode PD and a transmission transistor Tr in the single pixel 2 of the solid state imaging device 1 according to the embodiment, and FIG. 3 shows a cross-sectional configuration taken along the line III-III shown in FIG. 2. In the following description, the first conductive type is p type, and the second conductive type is n type.

In the solid state imaging device 1 according to the embodiment, the pixel 2 formed of the photodiode PD and the plurality of pixel transistors Tr is formed in a p-type well area 21 formed on the semiconductor substrate 30 formed of n-type or p-type silicon. In FIG. 2 and FIG. 3, among the plurality of pixel transistors, only the transmission transistor Tr formed of a vertical transistor is shown, and the other pixel transistors are not shown.

Each pixel 2 is formed in an area partitioned by a pixel isolation area 22 formed of the p-type semiconductor area. The single pixel 2 is provided with first and second photodiodes PD1 and PD2 formed by a plurality of layers (in FIG. 3, two layers) in a depth direction of the semiconductor substrate 30. The first and second photodiodes PD1 and PD2 constitute the photoelectric conversion element, and include the p-type semiconductor 23, the n-type semiconductor area 24, the p-type semiconductor area 25, and the n-type semiconductor area 26 formed in order of the depth direction of the semiconductor substrate 30.

The first photodiode PD1 formed on the surface side of the semiconductor substrate 30 is mainly formed of pn junction ja between the p-type semiconductor area 23 formed on the outermost surface of the semiconductor substrate 30 and the n-type semiconductor area 24 formed on the lower layer thereof. The n-type semiconductor area 24 of the first photodiode PD1 is a charge accumulation area, and the signal charges generated by the first photodiode PD1 are accumulated in the n-type semiconductor area 24. The second photodiode PD2 is mainly formed of pn junction jb between the p-type semiconductor area 25 formed on the lower layer of the n-type semiconductor area 24 that is the charge accumulation area of the first photodiode PD1 and the n-type semiconductor area 26 formed on the lower layer thereof. The n-type semiconductor area 26 of the second photodiode PD2 is a charge accumulation area, and the signal charges generated by the second photodiode PD2 are accumulated in the n-type semiconductor area 26.

The vertical transmission transistor Tr includes a transmission gate electrode 20 vertically extending from the surface side of the semiconductor substrate 30 in the depth direction, and a floating diffusion area FD formed close to the transmission gate electrode 20.

The transmission gate electrode 20 includes a columnar embedded electrode 20a formed in a groove portion 29 formed in the depth direction of the semiconductor substrate 30, and a surface electrode 20b formed to protrude from the surface of the semiconductor substrate 30 on the embedded electrode 20a. The embedded electrode 20a and the surface electrode 20b is formed of, for example, polysilicon, and is formed in the groove portion 29 or on the surface of the semiconductor substrate 30 through a gate insulating film 28 formed of, for example, an oxide film.

The floating diffusion area FD is formed of a high concentration n-type semiconductor area formed on the surface side of the semiconductor substrate 30, and is formed close to the surface electrode 20b of the transmission gate electrode 20. As shown in FIG. 2, the transmission transistor Tr is formed in the corner of the single pixel 2, that is, in the corner of the area where the photodiode PD is formed.

In an inner circumferential face of the groove portion 29 for forming the vertical transmission gate electrode 20 formed in the depth direction of the semiconductor substrate 30, an impurity ion injection area 33 for interface state adjustment of the gate is formed. In the embodiment, as the impurity ion injection area 33, a high concentration p-type semiconductor area for suppressing dark current is formed. The impurity ion injection area 33 formed of the p-type semiconductor area has a function of removing the dark current generated from the interface between the gate insulating film 28 and the semiconductor substrate 30 caused by crystal fault and distortion when the groove portion 29 is formed by selective etching or the like, by recombining charges (electrons) that become white defects.

In the area of the first and second photodiode PD1 and PD2 close to the transmission gate electrode 20, a transmission path 32 formed of the n-type semiconductor area electrically connecting the n-type semiconductor area 24 and 26 of the photodiodes is formed. To form the transmission path 32, the p-type semiconductor area 25 constituting the second photodiode PD2 is formed to be offset by a necessary distance from the embedded electrode 20a of the transmission gate electrode 20. That is, the p-type semiconductor area 25 is formed away from the embedded electrode 20a by a width of the transmission path 32. By forming the transmission path 32, the signal charge is movable between the n-type semiconductor area 24 of the first photodiode PD1 and the n-type semiconductor area 26 of the second photodiode PD2.

In the solid state imaging device 1 according to the embodiment, an overflow path 27 is formed between the first and second photodiodes PD1 and PD2 and the floating diffusion area FD. The overflow path 27 is formed of a first n-type semiconductor area 27a formed on the bottom portion of the embedded electrode 20a and a second n-type semiconductor area 27b formed on the lower layer of the floating diffusion area FD. The first and second n-type semiconductor areas 27a and 27b constituting the overflow path 27 are formed in concentration lower than that of the n-type semiconductor area constituting the transmission path 32. The overflow path 27 is formed to come in contact with the transmission path 32, the impurity ion injection area 33, and the floating diffusion area FD. As shown in FIG. 3, the signal charges e overflowing from the photodiode PD by the overflowing path 27 are discharged to the floating diffusion area FD through the bottom portion of the embedded electrode 20a.

In the embodiment, although not shown, the reset transistor, the amplification transistor, and the selection transistor constituting the other pixel transistors are formed for each pixel on the surface side of the semiconductor substrate 30. Although not shown, a multilayer wiring layer in which a plurality of layers of wiring are provided through an interlayer insulating film is formed on the surface side of the semiconductor substrate 30.

The solid state imaging device 1 according to the embodiment is formed as a backside illumination solid state imaging device in which light L is illuminated from the back face side of the semiconductor substrate 30. For this reason, although now shown, on the back face side of the semiconductor substrate 30, a p-type semiconductor area for suppressing dark current is formed in high concentration is formed to come in contact with the n-type semiconductor area 26. On the back face side of the semiconductor substrate 30, although not shown, a color filter layer and an on-chip lens are formed through a planarization film.

1-3. Operation

Next, an operation of the solid state imaging device 1 according to the embodiment will be described. At the time of accumulating charges, the light input from the back face side of the semiconductor substrate 30 is absorbed by the first and second photodiodes PD1 and PD2, and is photoelectrically converted, thereby generating signal charges corresponding to light quantity. The generated signal charges (in the embodiment, electrons) are moved to the n-type semiconductor areas 24 and 26 according to potential gradation, and are accumulated in a place with the lowest potential energy. That is, in the first photodiode PD1, the signal charges are accumulated in the n-type semiconductor area 24, and in the second photodiode PD2, the signal charges are accumulated in the n-type semiconductor area 26. The n-type semiconductor areas 24 and 26 are fully-depleted, and the signal charges are accumulated in the potential.

When intense light is input, a large amount of signal charges are generated, and is over a saturation charge amount of any one of the first and second photodiodes PD1 and PD2. The signal charges over the saturation charge amount are over the potential of the transmission path 32, and are accumulated in the n-type semiconductor area of the photodiode which does not reach the other saturation.

For example, when the n-type semiconductor area 24 of the first photodiode PD1 reaches the saturation charge amount, the signal charges over the saturation charge amount are accumulated in the n-type semiconductor area 24 of the adjacent second photodiode PD2 through the transmission path 32. When the n-type semiconductor area 26 of the second photodiode PD2 reaches the saturation charge amount, the signal charges e over the saturation charge amount are moved to the floating diffusion area FD through the overflow path 27 formed at the bottom portion of the transmission gate electrode 20.

In the solid state imaging device 1 according to the embodiment, the plurality of photodiodes PD (PD1 and PD2) are laminated in the depth direction of the semiconductor substrate 30 to connect the n-type semiconductor areas 24 and 26 through the transmission path 32. At the time of accumulating the charges, when any one of the photodiodes PD (PD1 and PD2) reaches the saturation charge amount, the signal charges over the saturation charge amount are accumulated in the other photodiode PD (PD1 or PD2) which is not saturated, through the transmission path 32. With such a configuration, even when the pixel size is reduced, the effective saturation charge amount per single pixel is increased, it is possible to widen the dynamic range, and thus it is possible to improve contrast.

Meanwhile, at the time of transmitting the charges, a desired transmission pulse is applied to the transmission gate electrode 20, and the potential of the transmission path 32 formed around the transmission gate electrode 20 becomes deep. Accordingly, the signal charges accumulated in the first and second photodiodes PD1 and PD2 bypass the vertical transmission gate electrode 20, mainly, through the transmission path 32 on the surface side of the semiconductor transmission path of the substrate 30, and are read in the floating diffusion area FD.

That is, in the embodiment, the general transmission path of the signal charges and the overflow path 27 are separated, thus the transmission of the signal charges and the freedom in design of the overflow path 27 are increased, and it is possible to optimize independence.

Since the transmission transistor Tr is configured as the vertical transistor and the transmission transistor Tr is formed in the corner of the pixel 2, it is possible to enlarge the area of the photodiode PD, and thus it is possible to increase the saturation charge amount per unit volume. Since the impurity ion injection area 33 formed of the p-type semiconductor area is formed to cover the whole of the vertical transmission gate electrode 20, the dark current caused by the defect present in the side face and the bottom portion of the embedded electrode 20a is prevented from occurring, and thus it is possible to prevent the white defect from occurring.

Figure 4:
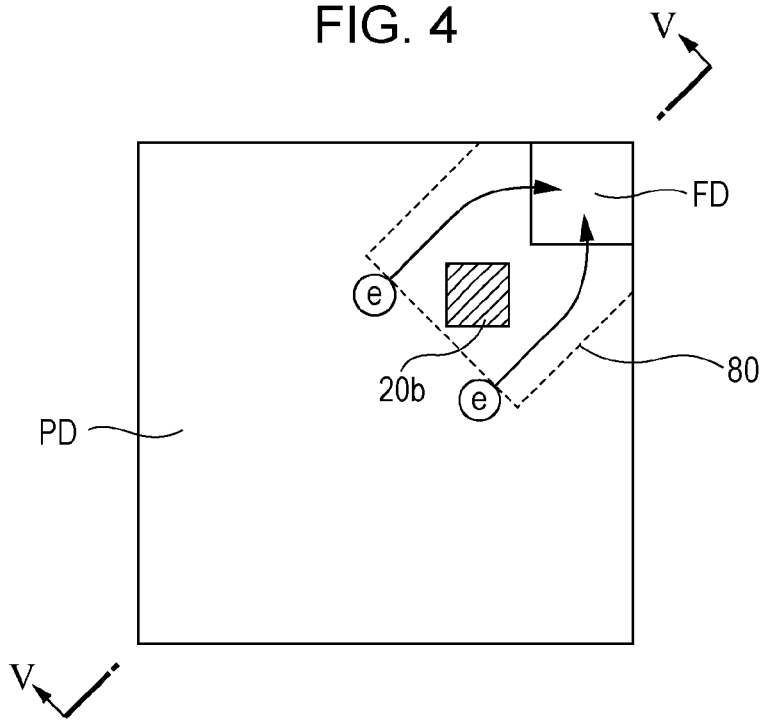
FIG. 4 is a diagram illustrating a plan configuration of the single pixel of the solid state imaging device according to a comparative example.
Figure 5:
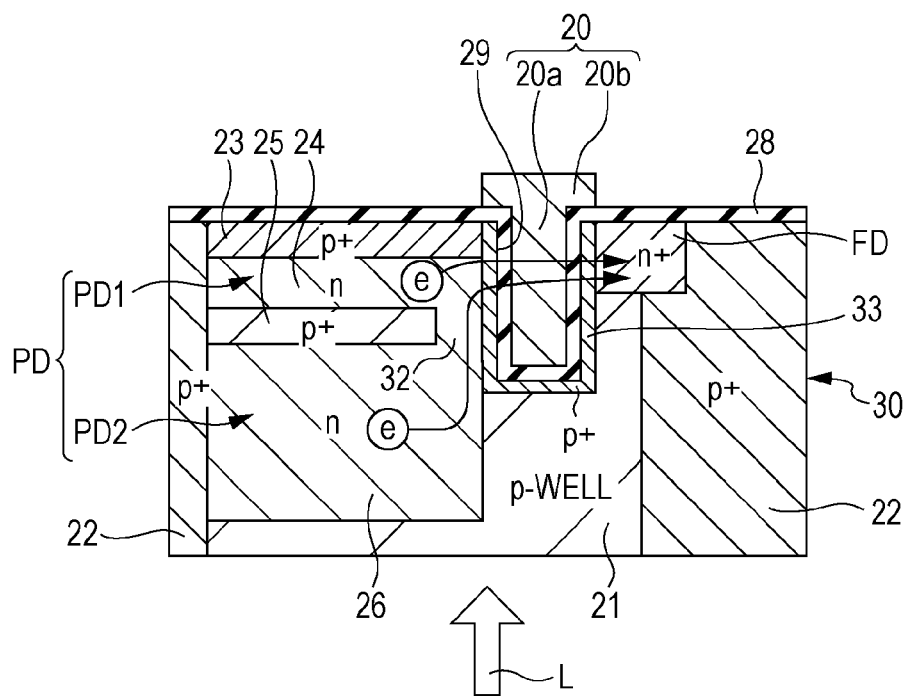
FIG. 5 is a diagram illustrating a cross-sectional configuration taken along the line V-V shown in FIG. 4.

FIG. 4 shows a plan configuration of the single pixel of the solid state imaging device according to a comparative example, and FIG. 5 shows a cross-sectional configuration taken along the line V-V shown in FIG. 4. In FIG. 4 and FIG. 5, the same reference numerals and signs are given to the parts corresponding to FIG. 2 and FIG. 3, and the description thereof is not repeated.

In FIG. 4 and FIG. 5, the overflow path 27 shown in FIG. 2 and FIG. 3 is not formed. In the solid state imaging device shown in FIG. 4 and FIG. 5, the area surrounding the embedded electrode 20a on the surface of the semiconductor substrate 30 constitutes an overflow path 80. In the comparative example, at the time of accumulating the charges, the signal charges e over the saturation charge amount of the first and second photodiodes PD1 and PD2 bypass the embedded electrode 20a and are discharged to the floating diffusion area FD as indicated by arrows shown in FIG. 4 and FIG. 5. In the solid state imaging device in the comparative example, the overflow path 80 is a path used as the general transmission path of signal charges.

In FIG. 5, although the overflow path 80 is not shown, as shown in FIG. 4, the overflow path 80 is formed around the embedded electrode 20a, and thus it is necessary to form the overflow path 80 in the range larger than a diameter of the embedded electrode 20a. In the solid state imaging device of the comparative example, when the shape and formation position of the embedded electrode 20a are scattered, variation occurs in the state of applying the potential in the area of the overflow path 80. Accordingly, variation of the saturation charge amount occurs, a dynamic range is reduced, and a yield is decreased. In the solid state imaging device of the comparative example, when the position of the embedded electrode 20a changed with respect to the overflow path 80, the overflow may be accelerated, and the saturation charge amount is decreased. As described above, in the solid state imaging device of the comparative example, the variation of the shape and formation position of the embedded electrode 20a may easily and directly affect quality.

On the other hand, in the embodiment, the overflow path 27 may be formed at the bottom portion of the embedded electrode 20a, and may be formed in the range of correcting the transmission path 32 and the floating diffusion area FD. Accordingly, in the embodiment, as shown in FIG. 2, the formation area at the bottom portion of the embedded electrode 20a of the overflow path 27 may be formed to be reduced to substantially the same extent as the outer diameter of the embedded electrode 20a of the transmission gate electrode 20 formed on the semiconductor substrate 30 in the columnar shape. Accordingly, it is not necessary to form the n-type semiconductor area for the overflow path in the extra area, and a robust structure with respect to production variation of the embedded electrode 20a is formed.

1-4. Production Method

FIG. 6A to FIG. 8B are diagrams illustrating a production process of the solid state imaging device 1 according to the embodiment. A method of producing the solid state imaging device 1 according to the embodiment will be described with reference to FIG. 6A to FIG. 8B.

Figure 6A:
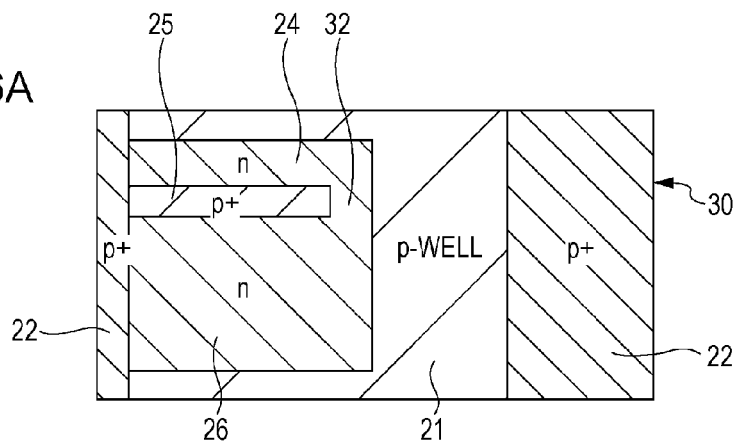
FIG. 6A to FIG. 6C are diagrams illustrating a process of producing the solid state imaging device according to the first embodiment of the present disclosure.

First, as shown in FIG. 6A, the n-type semiconductor areas 24 and 26 of the first and second photodiodes PD1 and PD2 and the n-type semiconductor area constituting the transmission path 32 are formed in a p-type well area 21 of the semiconductor substrate 30 by ion injection on the surface side. Thereafter, by ion injection of p-type impurities from the surface side of the semiconductor substrate 30, the p-type semiconductor area 25 of the second photodiode PD2 is formed at a necessary position. The pixel isolation area 22 is formed at a position of partitioning the pixels 2 of the semiconductor substrate 30 by high concentration ion injection of a p-type impurity area.

Figure 6B:
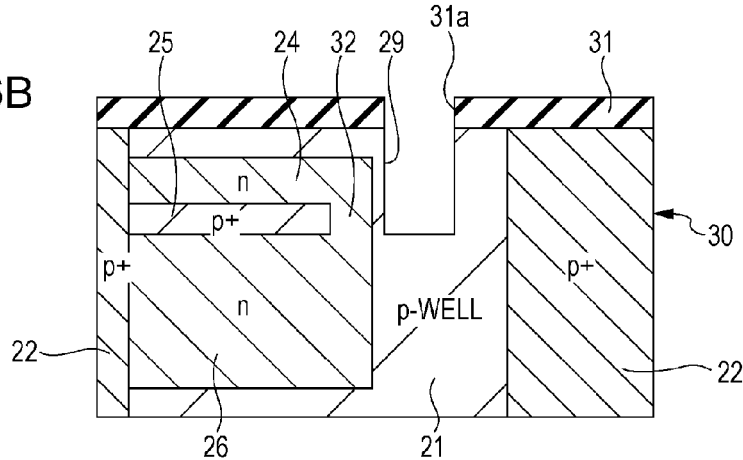

Then, as shown in FIG. 6B, an insulating film 31 formed of SiN, for example, by CVD (Chemical Vapor Deposition) is formed on the surface of the semiconductor substrate 30, and an opening portion 31a exposing the surface of the semiconductor substrate 30 is formed corresponding to the part of forming the transmission gate electrode 20. The semiconductor substrate 30 is etched to a desired depth using the insulating film 31 provided with the opening portion 31a as a mask. Accordingly, the groove portion 29 is formed in the area where the transmission gate electrode 20 of the semiconductor substrate 30 is formed.

Figure 6C:
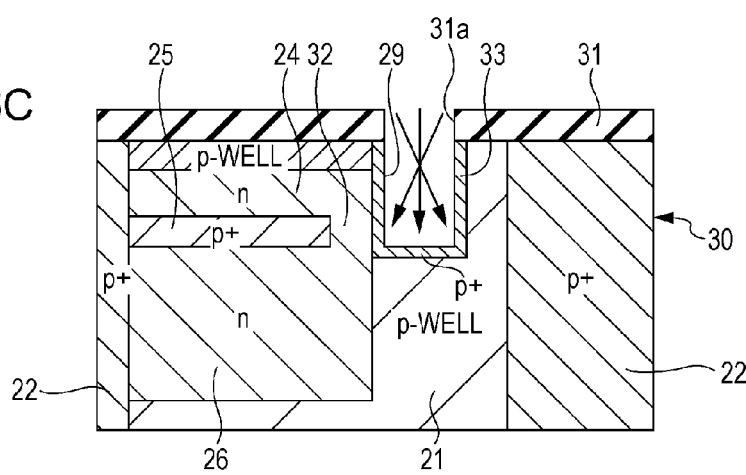

Subsequently, using the insulating film 31 provided with the same opening portion 31a as a mask, ion injection of p-type impurities is performed. Accordingly, as shown in FIG. 6C, the impurity ion injection area 33 for interface state adjustment is formed on the side face and the bottom face of the groove portion 29. In this case, on the side face of the groove portion 29, the impurity ion injection area 33 formed of the p-type semiconductor area is formed by oblique ion injection with a tilt angle.

Figure 7A:
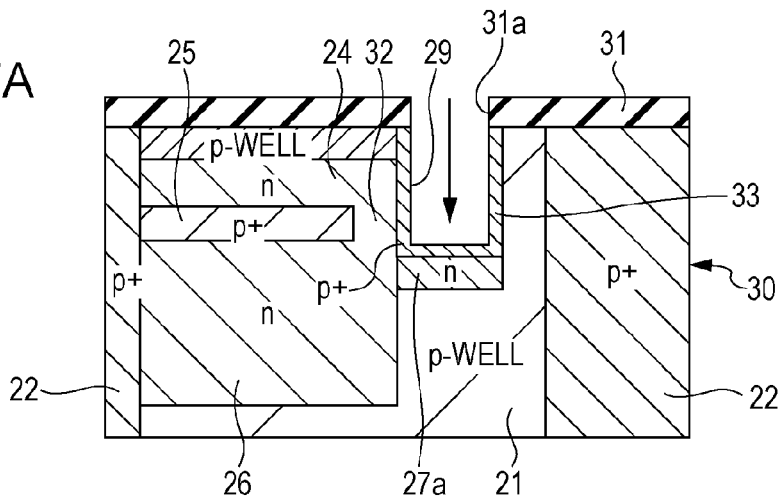
FIG. 7A to FIG. 7C are diagrams illustrating a process of producing the solid state imaging device according to the first embodiment of the present disclosure.

Then, ion injection of n-type impurities is performed using the insulating film 31 provided with the same opening portion 31a as a mask. Accordingly, as shown in FIG. 7A, the first n-type semiconductor area 27a constituting the overflow path 27 is formed on a layer lower than the impurity ion injection area 33. In this case, the first n-type semiconductor area 27a is formed in an area wider than the opening portion 31a of the insulating film 31 by diffusion of the n-type impurities injected by ions. On the first and second photodiodes PD1 and PD2 side, the first n-type semiconductor area 27a constituting the overflow path 27 is formed to come in contact with the n-type semiconductor area constituting the transmission path 32. The first n-type semiconductor area 27a constituting the overflow path 27 is formed such that the potential thereof is shallower than the potential of the n-type semiconductor areas 24 and 26 constituting the first and second photodiodes PD1 and PD2 or the n-type semiconductor area constituting the transmission path 32.

In the embodiment, the first n-type semiconductor area 27a constituting the overflow path 27 may be formed using a mask formed of the insulating film 31 for forming the groove portion 29 embedding the transmission gate electrode 20. As a result, it may be formed just under the part where the transmission gate electrode 20 in self alignment. To form the first n-type semiconductor area 27a constituting the overflow path 27 after forming the groove portion 29, the overflow path 27 may be formed with high precision at a regular distance from the bottom portion of the groove portion 29.

Figure 7B:
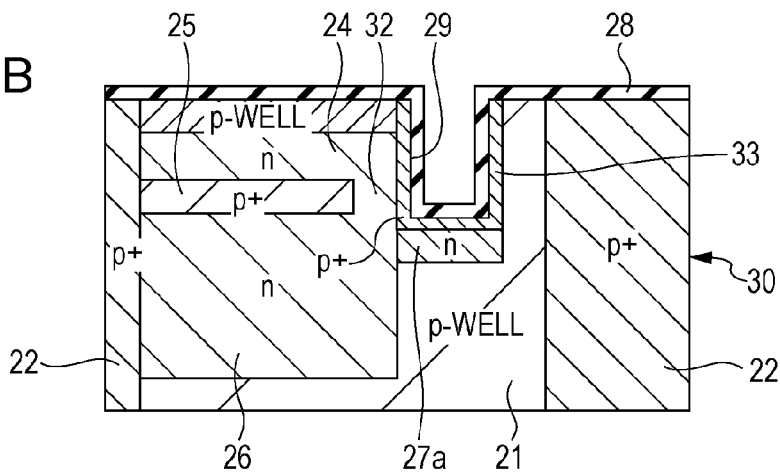

Then, as shown in FIG. 7B, the insulating film 31 used as the mask is removed, and then the gate insulating film 28 is formed on the surface of the semiconductor substrate 30 including an inner circumferential face of the groove portion 29. The gate insulating film 28 may be, for example, a silicon oxide film.

Figure 7C:
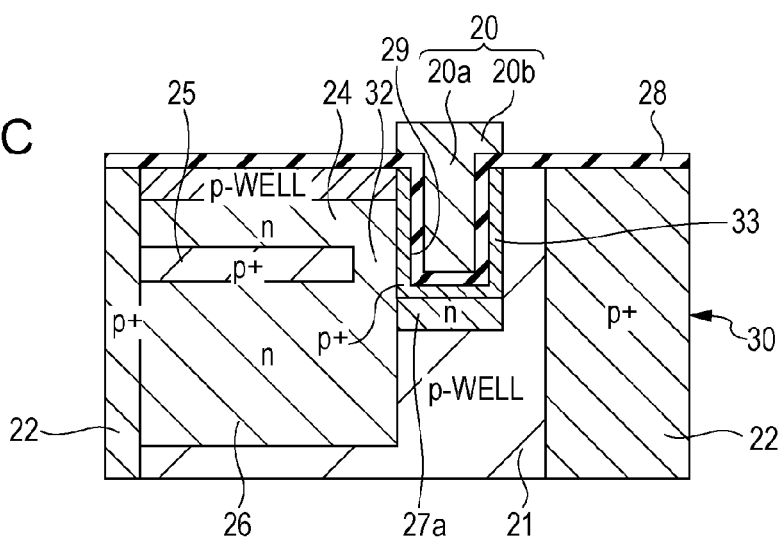

Then, a gate electrode material formed of, for example, a polysilicon film is formed and patterned to be embedded in the groove portion 29 and to coat the surface of the semiconductor substrate 30. Accordingly, as shown in FIG. 7C, the transmission gate electrode 20 formed of the surface electrode 20b protruding to the surface of the semiconductor substrate 30 and the columnar embedded electrode 20a embedded in the groove portion 29 is formed. In this case, although not shown, the gate electrode constituting the other pixel transistors is also formed on the surface side of the semiconductor substrate 30.

Then, as shown in FIG. 8A, in the area in which the first and second photodiodes PD1 and PD2 and the area adjacent through the transmission gate electrode 20, a photoresist film 34 communicating with the area in which the floating diffusion area FD is formed. Subsequently, ion injection of n-type impurities is performed in the same depth as that of the first n-type semiconductor area 27a constituting the previously formed overflow path 27, to form the second n-type semiconductor area 27b. The overflow path 27 is configured by the second n-type semiconductor are 27b and the first n-type semiconductor area 27a formed at the bottom portion of the transmission gate electrode 20.

Thereafter, ion injection of n-type impurities is performed in concentration higher than impurity concentration constituting the overflow path 27, to form the floating diffusion area FD. The depth of the floating diffusion area FD may be adjusted according to the depth of the embedded electrode 20a of the transmission gate electrode 20, and may be arbitrarily set. In the embodiment, the second n-type semiconductor 27b constituting the overflow path 27 is formed on the lower layer of the floating diffusion area FD, but the second n-type semiconductor area 27b may not necessarily be formed. For example, the floating diffusion area FD may be formed to the depth of the embedded electrode 20a, to connect the first n-type semiconductor area 27a constituting the overflow path 27 and the floating diffusion area FD.

In the embodiment, at the time of forming the floating diffusion area FD, the second n-type semiconductor area 27b constituting the overflow path 27 is formed. The second n-type semiconductor area 27b constituting the overflow path 27 is formed at the depth position from the substrate surface to some extent, and thus it is preferable to form the photoresist film 34 to cover the whole of the transmission gate electrode 20.

Then, as shown in FIG. 8B, a photoresist film 35 communicating with the area in which the first and second photodiodes PD1 and PD2 are formed is formed, and ion injection of p-type impurities is performed in high concentration on the surface of the semiconductor substrate 30 through the photoresist film 35. Accordingly, the dark current is suppressed, and the p-type semiconductor area 23 constituting the first photodiode PD1 is formed. In the embodiment, the p-type semiconductor area 23 is formed in self alignment on the side coming in contact with the transmission gate electrode 20.

Thereafter, a multilayer wiring layer is formed using the general method, and a planarization film, a color filter layer, are an on-chip lens are sequentially formed on the back face side of the semiconductor substrate 30, thereby completing the solid state imaging device according to the embodiment.

In the method of producing the solid state imaging device 1 according to the embodiment, the first n-type semiconductor area 27a constituting the overflow path 27 is formed through the same mask as the mask for forming the groove portion 29 forming the transmission gate electrode 20. For this reason, it is possible to form the first n-type semiconductor area 27a at the bottom portion of the transmission gate electrode 20 in self alignment, and it is possible to match with the transmission gate electrode 20 with high precision. For this reason, the formation position of the transmission gate electrode 20 with respect to the overflow path 27 is not scattered. Accordingly, it is possible to reduce the change of the overflow path 27 and the variation of the saturation charge amount for each pixel.

In the solid state imaging device 1 according to the embodiment, the general transmission path of signal charges when the transmission gate electrode 20 is turned on and the overflow path 27 for overflowing the signal charges at the time of accumulating charges are formed independently from each other. For this reason, it is possible to optimally form the areas. Accordingly, as compared with the solid state imaging device shown in FIG. 4 and FIG. 5, it is possible to improve the charge transmission efficiency and to increase the saturation charge amount.

1-5. Modified Example 1

Figure 9:
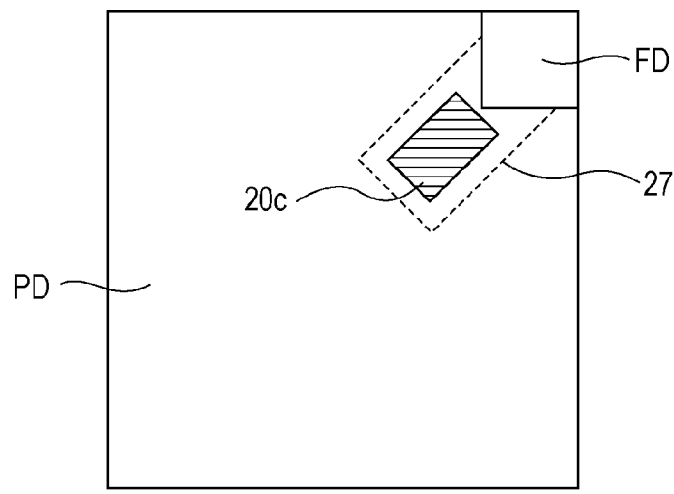
FIG. 9 is a diagram illustrating a plan configuration of an area including a photodiode PD and a transmission transistor Tr in a single pixel of a solid state imaging device according to a modified example 1.

Next, a solid state imaging device according to a modified example 1 of the embodiment will be described. FIG. 9 is a diagram illustrating a plan configuration of an area including a photodiode PD and a transmission transistor Tr in a single pixel of the solid state imaging device according to the modified example 1. The solid state imaging device according to the modified example 1 is an example in which the shape of the embedded electrode 20c of the vertical transmission gate electrode is different from that of the solid state imaging device according to the embodiment. In FIG. 9, the same reference numerals and signs are given to the parts corresponding to FIG. 2, and the description thereof is not repeated.

In the modified example 1, the embedded electrode 20c is formed longitudinally from the area in which the photodiode PD is formed to the floating diffusion area FD. Also in this case, the overflow path 27 formed at the bottom portion of the embedded electrode 20c is formed in self alignment when the groove portion forming the embedded electrode 20c. As shown in the modified example 1, the embedded electrode 20c of the transmission gate electrode is formed longitudinally from the area in which the photodiode PD is formed to the floating diffusion area FD, and it is also possible to form the overflow path 27 longitudinally. As described above, even when the shape of the embedded electrode 20c of the transmission gate electrode 20 of the embodiment is changed, it is possible to form the overflow path 27 corresponding thereto, and thus it is possible to reduce the variation in pixels.

As shown in the modified example 1, in the area between the photodiode PD and the floating diffusion area FD, it is possible to keep the overflow path 27 long, and there is an effect that the floating diffusion area FD and the overflow path 27 are easily connected to each other.

1-6. Modified Example 2

Figure 10:
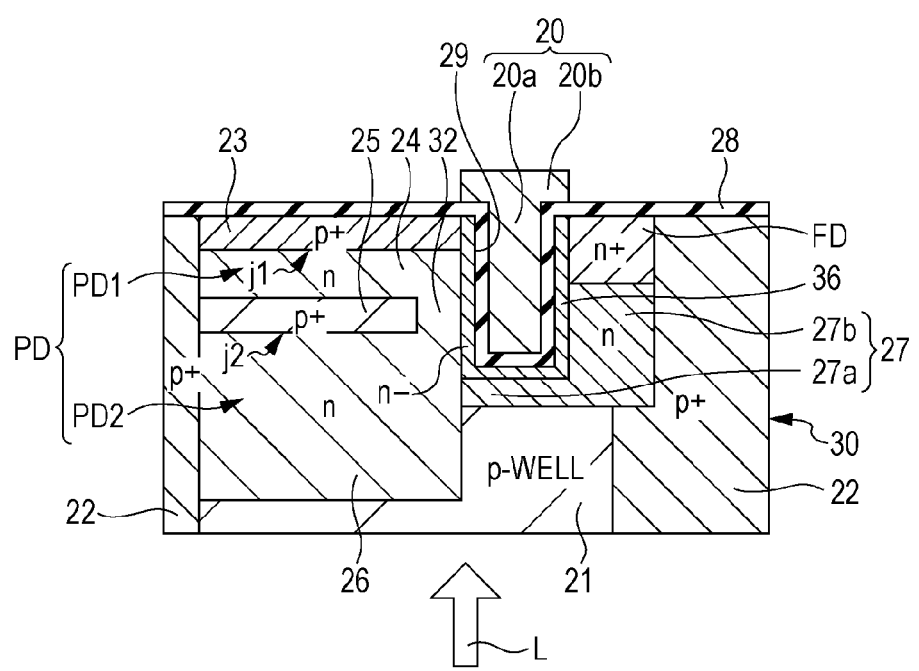
FIG. 10 is a diagram illustrating a cross-sectional configuration of a main portion of a solid state imaging device according to a modified example 2.

Next, a solid state imaging device according to a modified example 2 of the embodiment will be described. FIG. 10 is a diagram illustrating a cross-sectional configuration of a main part of the solid state imaging device according to the modified example 2. In FIG. 10, the same reference numerals and signs are given to the parts corresponding to FIG. 3, and the description thereof is not repeated.

In the modified example 2, the impurity ion injection area 36 for interface state adjustment around the embedded electrode 20a of the transmission gate electrode 20 is configured in an n-area in which ion injection of n-type impurities is performed in low concentration. To form the vertical transmission gate electrode 20, the groove portion 29 is formed on the semiconductor substrate 30. However, when occurrence of a defect caused by an effect of engraving the groove portion 29 is little, the dark current generated from the groove portion 29 is little. In such a case, as shown in FIG. 10, the impurity ion injection area 36 around the groove portion 29 may be an n-area with concentration lower than those of the first n-type semiconductor area 27a and the second n-type semiconductor area 27b constituting the overflow path 27.

As described above, the impurity ion injection area 36 around the embedded electrode 20a of the transmission gate electrode 29 is the n-area, and thus there is an effect of improving the transmission of signal charges.

2. Second Embodiment

Solid State Imaging Device

Next, a method of producing a solid state imaging device according to a second embodiment will be described. FIG. 11A to FIG. 12C are process diagrams illustrating a method of producing the solid state imaging device according to the embodiment. A configuration of the final solid state imaging device formed in the embodiment is the same as that of FIG. 3, the description thereof is not repeated, and only the production method will be described.

Figure 11A:
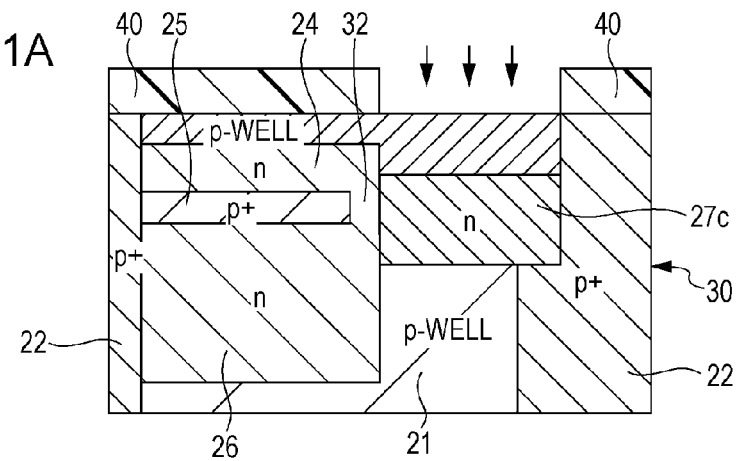
FIG. 11A to FIG. 11C are diagrams illustrating a method of producing a solid state imaging device according to the embodiment.

First, as shown in FIG. 6A, the n-type semiconductor areas 24 and 26 constituting the first and second photodiodes PD1 and PD2 and the p-type semiconductor area 25 are formed on the semiconductor substrate 30, and the pixel isolation area 22 is formed. Thereafter, as shown in FIG. 11A, a photoresist film 40 communicating with the area of forming the overflow path 27 is formed. Ion injection of n-type impurities is performed from the surface of the semiconductor substrate 30 through the photo resist film 40, to form the n-type semiconductor area 27c constituting the overflow path 27. The n-type semiconductor area 27c constituting the overflow path 27 is formed such that the potential thereof is shallower than the potential of the n-type semiconductor areas 24 and 26 of the first and second photodiodes PD1 and PD2 and the n-type semiconductor area constituting the transmission path 32.

Figure 11B:
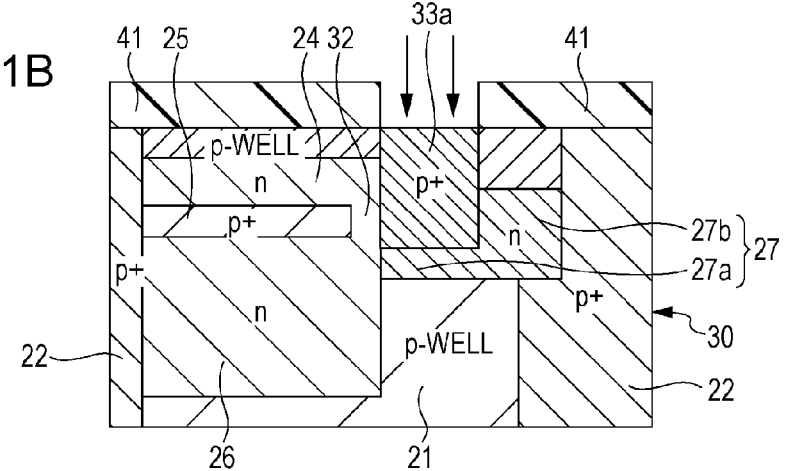

Then, the photoresist film 40 for forming the overflow path 27 is removed, then, as shown in FIG. 11B, a photoresist film 41 communicating with an area slightly larger than the area of forming the embedded electrode 20a of the transmission gate electrode 20 is formed on the substrate 30. Ion injection of p-type impurities is performed in high concentration through the photoresist film 41, to form the p-type impurity area 33a that is the impurity ion injection area 33 for interface state adjustment. In this case, the p-type impurity area 33a that is the impurity ion injection area 33 is formed at the position shallower than the n-type semiconductor area 27c constituting the overflow path 27. Accordingly, the first n-type semiconductor area 27a and the second n-type semiconductor area 27b constituting the overflow path 27 remain on the lower layer of the p-type impurity area 33a and the area adjacent to the opposite side to the side on which the photodiode PD.

Figure 11C:
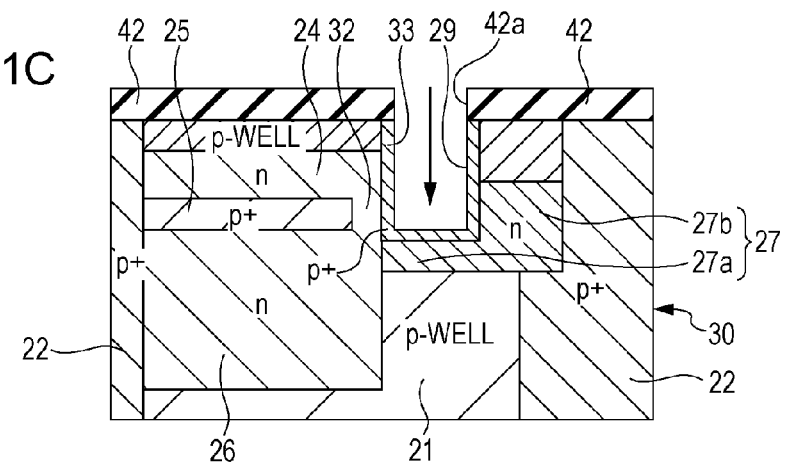

Then, the photoresist film 41 is removed, then, as shown in FIG. 11c, an insulating film 42 formed of SiN is formed on the surface of the semiconductor substrate 30, for example, by CVD, and an opening portion 42a exposing the surface of the semiconductor substrate 30 is formed corresponding to the part of forming the transmission gate electrode 20. Herein, the insulating film 42 communicating with the inside of the area in which the impurity ion injection area 33 is formed. The semiconductor substrate 30 is etched to a desired depth, using the insulating film 42 provided with the opening portion 42a as a mask. Accordingly, the groove portion 29 is formed in the area where the transmission gate electrode 20 of the semiconductor substrate 30 is formed.

Figure 12A:
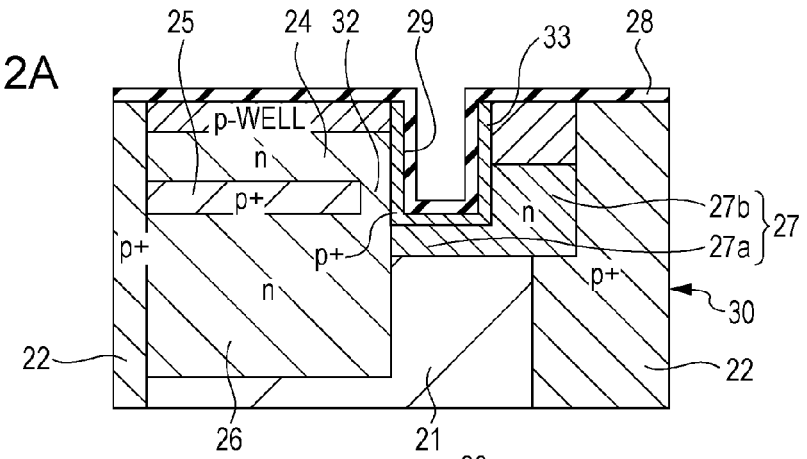
FIG. 12A to FIG. 12C are diagrams illustrating a method of producing a solid state imaging device according to the embodiment.
Figure 12B:
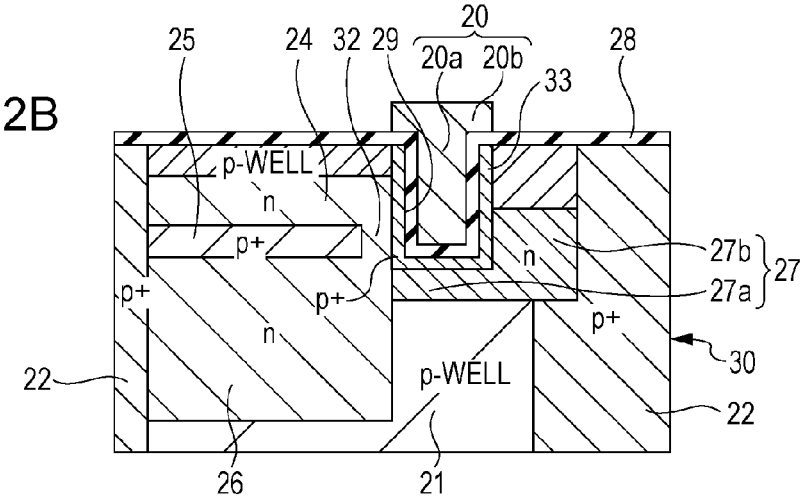

Then, the insulating film 42 used as the mask is removed, as shown in FIG. 12A, a gate insulating film 28 is formed on the surface of the semiconductor substrate 30 including an inner circumferential face of the groove portion 29. The gate insulating film 28 may be, for example, a silicon oxide film.

Then, a gate electrode material formed of, for example, a polysilicon film is formed and patterned to be embedded in the groove portion 29 and to coat the surface of the semiconductor substrate 30. Accordingly, the columnar transmission gate electrode 20 partially protruding to the surface of the semiconductor substrate 30 and embedded in the groove portion 29 is formed. In this case, although not shown, the gate electrode constituting the other pixel transistors is also formed on the surface side of the semiconductor substrate 30.

Figure 12C:
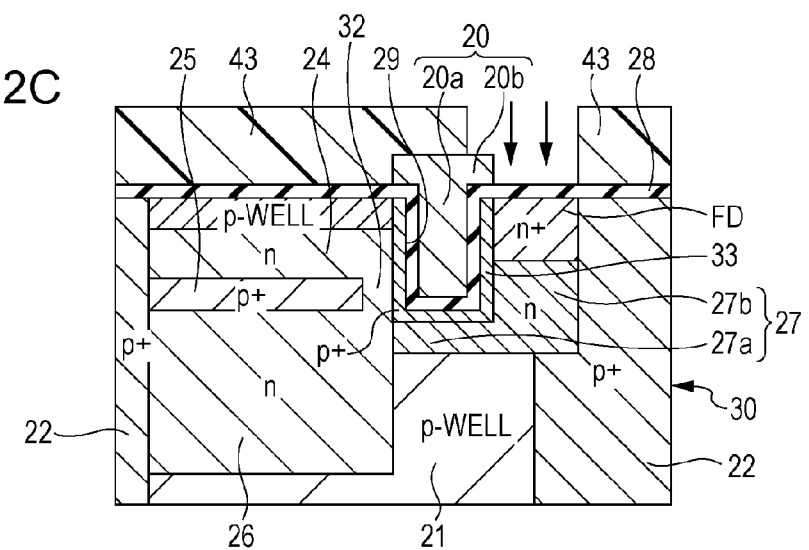

Then, as shown in FIG. 12C, a photoresist film 43 communicating with the area in which the floating diffusion area FD is formed, at the upper portion of the second n-type semiconductor area 27b is formed. Ion injection of n-type impurities is performed in high concentration through the photoresist film 43, to form the floating diffusion area FD. The floating diffusion area FD is connected to the n-type semiconductor area 27b constituting the overflow path 27 formed at the front end.

In the embodiment, the floating diffusion area FD may be formed by the ion injection to the surface side of the semiconductor substrate 30, and thus the whole of the transmission gate electrode may not be coated by the photoresist film 43. For this reason, the passage of the photoresist film 43 is formed to overlap with the upper portion of the transmission gate electrode 20, and thus it is possible to perform positional matching of the floating diffusion area FD on the transmission gate electrode 20 side in self alignment.

Thereafter, the p-type semiconductor area 23 for suppressing the dark current is formed in the same process as FIG. 8A and FIG. 8B. A multilayer wiring layer is formed using the general method, and a planarization film, a color filter layer, are an on-chip lens are sequentially formed on the back face side of the semiconductor substrate 30, thereby completing the solid state imaging device according to the embodiment.

In the solid state imaging device in the embodiment, it is possible to obtain the same effect as that of the first embodiment.

3. Third Embodiment

Method of Producing Solid State Imaging Device

Figure 13A:
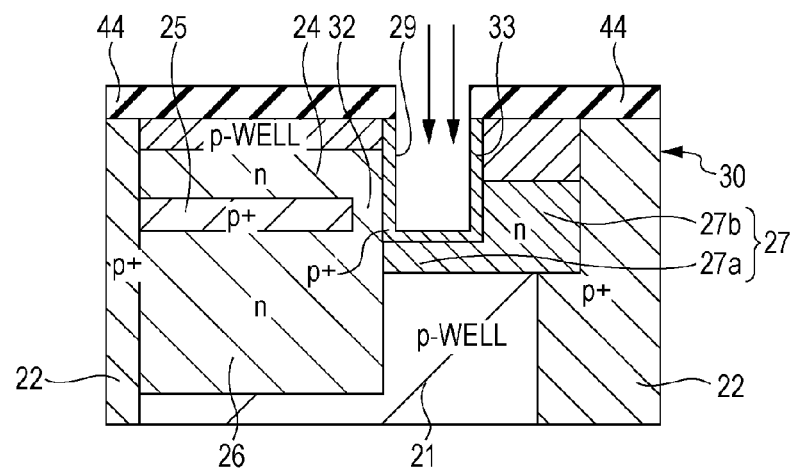
FIG. 13A and FIG. 13B are diagrams illustrating a method of producing a solid state imaging device according to a third embodiment of the present disclosure.
Figure 13B:
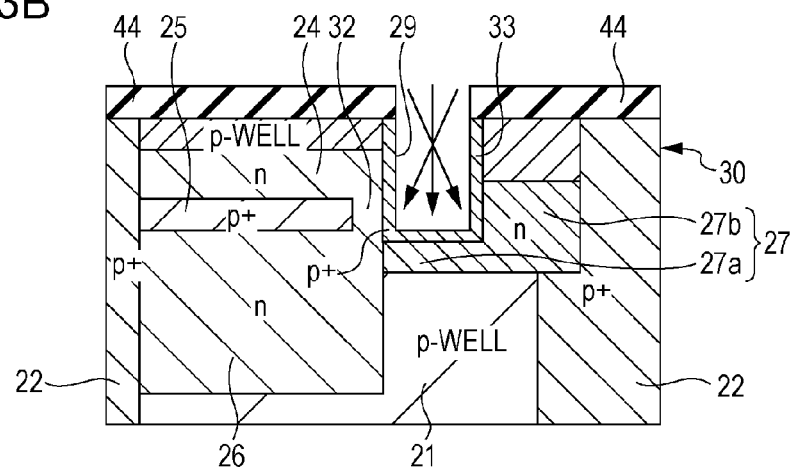

Next, a method of producing a solid state imaging device according to a third embodiment will be described. FIG. 13A and FIG. 13B are process diagrams illustrating a method of producing the solid state imaging device according to the embodiment. A configuration of the final solid state imaging device formed in the embodiment is the same as that of FIG. 3, the description thereof is not repeated, and only the production method will be described.

In the method of producing a solid state imaging device according to the embodiment, the n-type semiconductor area 27c that is the overflow path 27 is formed in the same manner as the process of FIG. 11A according to the second embodiment. Thereafter, as shown in FIG. 13A, an insulating film 44 formed of SiN formed, for example, by CVD is formed on the surface of the semiconductor substrate 30. In the insulating film 44, an opening portion 44a exposing the semiconductor substrate 30 is formed corresponding to the part of forming the transmission gate electrode 20. Subsequently, the semiconductor substrate 30 is etched to a desired depth using the insulating film 44 provided with the opening portion 44a as a mask. Accordingly, the groove portion 29 is formed in the area where the transmission gate electrode 20 of the semiconductor substrate 30 is formed.

Subsequently, as shown in FIG. 13B, using the insulating film 44 provided with the opening portion 44a as a mask in the same manner as the process described above, ion injection of p-type impurities is performed to form the p-type impurity area that is the impurity ion injection area 33 for interface state adjustment on the side face and the bottom face of the groove portion 29. In this case, on the side face of the groove portion 29, the impurity ion injection area 33 is formed by oblique ion injection with a tilt angle.

The process thereafter is the same as that of the second embodiment, and the description thereof is not repeated.

In the embodiment, the groove portion 29 and the impurity ion injection area 33 for interface state adjustment are formed by the same mask (the insulating film 44), and thus it is possible to reduce the number of processes.

4. Fourth Embodiment

Solid State Imaging Device

Figure 14:
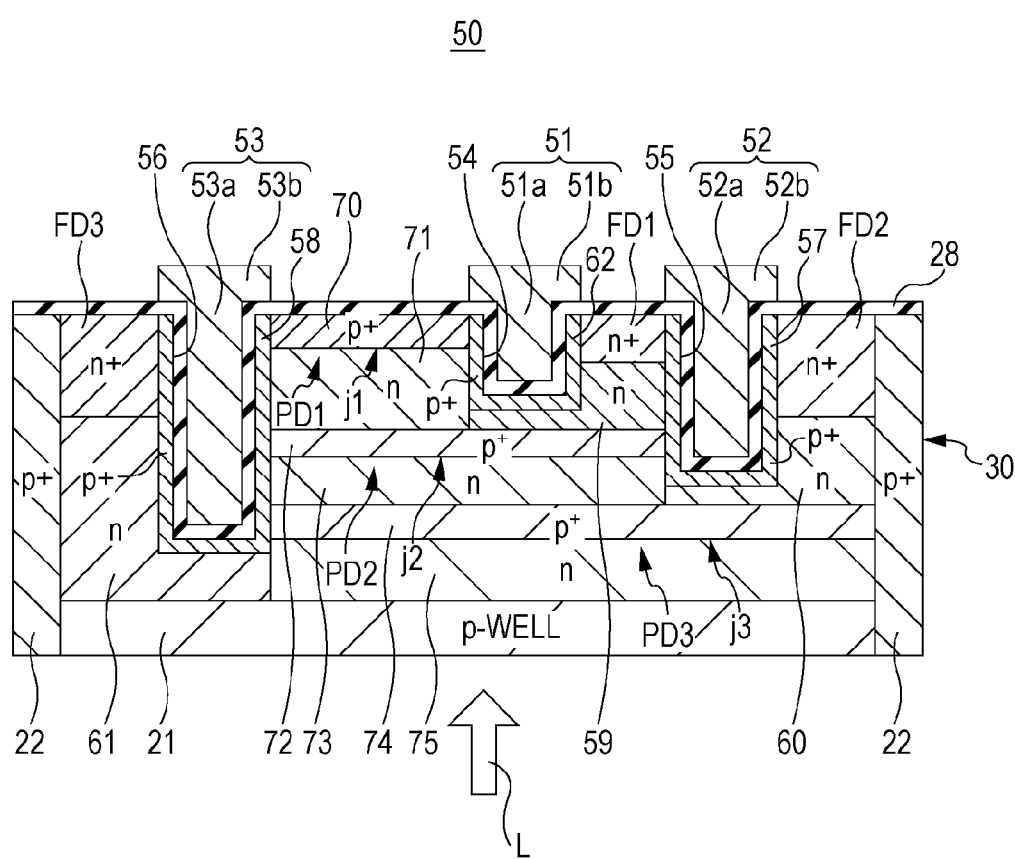
FIG. 14 is a diagram illustrating a cross-sectional configuration of a solid state imaging device according to a fourth embodiment of the present disclosure.

Next, a solid state imaging device according to a fourth embodiment will be described. FIG. 14 is a diagram illustrating a cross-sectional configuration of a main part of a solid state imaging device 50 according to the embodiment. The solid state imaging device 50 according to the embodiment is an example of performing spectrum of R, G, and B in the depth direction of the semiconductor substrate 30. In FIG. 14, the same reference numerals and signs are given to the parts corresponding to FIG. 3, and the description thereof is not repeated.

As shown in FIG. 14, in the solid state imaging device 50 according to the embodiment, three layers of photodiodes PD (first to third photodiodes PD1, PD2, and PD3) from the surface side of the semiconductor substrate 30 are formed in a single pixel surrounded by the pixel isolation area 22.

The first photodiode PD1 formed on the surface closest to the semiconductor substrate 30 is formed of pn junction j1 between the p-type semiconductor area 70 formed on the outmost surface of the semiconductor substrate 30 and the n-type semiconductor area 71 formed on the lower layer thereof. The second photodiode PD2 formed on the upper half of the semiconductor substrate 30 is formed of pn junction j2 between the p-type semiconductor area 72 formed on the lower layer of the n-type semiconductor area 71 constituting the first photodiode PD1 and the n-type semiconductor area 73 formed on the lower layer thereof. The third photodiode PD3 formed on the back side of the semiconductor substrate 30, that is, the light illumination face side is formed of pn junction j3 between the p-type semiconductor area 74 formed on the lower layer of the n-type semiconductor area 73 constituting the second photodiode PD2 and the n-type semiconductor area 75 formed on the lower layer thereof.

At the end portion of the area in which the first photodiode PD1 is formed, the vertical first transmission gate electrode 51 is formed in a depth reaching the n-type semiconductor area 71 of the first photodiode PD1. The first transmission gate electrode 51 is formed of an embedded electrode 51a formed to be embedded in a columnar shape in a depth direction from the surface of the semiconductor substrate 30 and a surface electrode 51b formed to protrude to the surface of the semiconductor substrate 30 on the upper portion of the embedded electrode 51a. The embedded electrode 51a is embedded in the groove portion 54 formed in the depth reaching the n-type semiconductor area constituting the first photodiode PD1 from the surface of the semiconductor substrate 30. The embedded electrode 51a and the surface electrode 51b are formed in the groove portion 54 and on the surface of the semiconductor substrate 30 through the gate insulating film 28.

In the area of the semiconductor substrate 30 surrounding the groove portion 54, the impurity ion injection area 62 formed of the p-type impurity area for interface state adjustment is formed. In the area on the opposite side to the side coming in contact with the first photodiode PD1 of the first transmission gate electrode 51, the first floating diffusion area FD1 formed of the n-type high concentration impurity area is formed.

The overflow path 59 formed of the n-type semiconductor area is formed from the lower layer of the impurity ion injection area 62 formed at the bottom portion of the first transmission gate electrode 51 to the lower layer of the first floating diffusion area FD1. The overflow path 59 is formed to electrically connect the n-type semiconductor area 71 constituting the first photodiode PD1 and the first floating diffusion area FD1. The potential in the n-type semiconductor area constituting the overflow path 59 is configured to be shallower than the potential of the n-type semiconductor area 71 constituting the first photodiode PD1 or the first floating diffusion area FD1.

At the end portion of the area in which the second photodiode PD2 is formed, the vertical second transmission gate electrode 52 is formed in a depth reaching the n-type semiconductor area 73 of the second photodiode PD2. The second transmission gate electrode 52 is formed of an embedded electrode 52a formed to be embedded in a columnar shape in a depth direction from the surface of the semiconductor substrate 30 and a surface electrode 52b formed to protrude to the surface of the semiconductor substrate 30 on the upper portion of the embedded electrode 52a. The embedded electrode 52a is embedded in the groove portion 55 formed in the depth reaching the n-type semiconductor area 73 constituting the second photodiode PD2 from the surface of the semiconductor substrate 30. The embedded electrode 52a and the surface electrode 52b are formed in the groove portion 55 and on the surface of the semiconductor substrate 30 through the gate insulating film 28.

In the area of the semiconductor substrate 30 surrounding the groove portion 55, the impurity ion injection area 57 formed of the p-type impurity area for interface state adjustment is formed. In the area on the opposite side to the side coming in contact with the second photodiode PD2 of the second transmission gate electrode 52, the second floating diffusion area FD2 formed of the n-type high concentration impurity area is formed.

The overflow path 60 formed of the n-type semiconductor area is formed from the lower layer of the impurity ion injection area 57 formed at the bottom portion of the second transmission gate electrode 52 to the lower layer of the second floating diffusion area FD2. The overflow path 60 is formed to electrically connect the n-type semiconductor area constituting the second photodiode PD2 and the second floating diffusion area FD2. The potential in the n-type semiconductor area constituting the overflow path 60 is configured to be shallower than the potential of the n-type semiconductor area 73 constituting the second photodiode PD2 or the second floating diffusion area FD2.

At the end portion of the area in which the third photodiode PD3 is formed, the vertical third transmission gate electrode 53 is formed in a depth reaching the n-type semiconductor area 75 of the third photodiode PD3. The third transmission gate electrode 53 is formed of an embedded electrode 53a formed to be embedded in a columnar shape in a depth direction from the surface of the semiconductor substrate 30 and a surface electrode 53b formed to protrude to the surface of the semiconductor substrate 30 on the upper portion of the embedded electrode 53a. The embedded electrode 53a is embedded in the groove portion 56 formed in the depth reaching the n-type semiconductor area 75 constituting the third photodiode PD3 from the surface of the semiconductor substrate 30. The embedded electrode 53a and the surface electrode 53b are formed in the groove portion 56 and on the surface of the semiconductor substrate 30 through the gate insulating film 28.

In the area of the semiconductor substrate 30 surrounding the groove portion 56, the impurity ion injection area 58 formed of the p-type impurity area for interface state adjustment is formed. In the area on the opposite side to the side coming in contact with the third photodiode PD3 of the third transmission gate electrode 53, the third floating diffusion area FD3 formed of the n-type high concentration impurity area is formed.

The overflow path 61 formed of the n-type semiconductor area is formed from the lower layer of the impurity ion injection area 58 formed at the bottom portion of the third transmission gate electrode 53 to the lower layer of the third floating diffusion area FD3. The overflow path 61 is formed to electrically connect the n-type semiconductor area 75 constituting the third photodiode PD3 and the third floating diffusion area FD3. The potential in the n-type semiconductor area constituting the overflow path 61 is configured to be shallower than the potential of the n-type semiconductor area 75 constituting the third photodiode PD3 or the third floating diffusion area FD3.

In the embodiment, the first photodiode PD1 and the second photodiode PD2 are electrically isolated by the p-type semiconductor area 72 constituting the second photodiode PD2. The second photodiode PD2 and the third photodiode PD3 are electrically isolated by the p-type semiconductor area 74 constituting the third photodiode PD3.

In the solid state imaging device 50 according to the embodiment, blue (B) light with a short wavelength is absorbed and photoelectrically converted in the third photodiode PD3 formed on the light incident side of the semiconductor substrate 30. Accordingly, in the n-type semiconductor area 75 of the third photodiode PD3, the signal charges based on the blue light are accumulated. In the second photodiode PD2, green (G) light with a middle wavelength is absorbed and photoelectrically converted. Accordingly, in the n-type semiconductor area 73 of the second photodiode PD2, the signal charges based on the green light are accumulated. In the first photodiode PD1, red (R) light with a long wavelength is absorbed and photoelectrically converted. Accordingly, in the n-type semiconductor area 71 of the first photodiode PD1, the signal charges based on the red light are accumulated.

Even in the embodiment, the signal charges accumulated in the first photodiode PD1 over the saturation charge amount pass through the overflow path 59 formed at the bottom portion of the first gate electrode 51 and are discharged to the first floating diffusion area FD1.

The signal charges accumulated in the second photodiode PD2 over the saturation charge amount pass through the overflow path 60 formed at the bottom portion of the second gate electrode 52 and are discharged to the second floating diffusion area FD2.

The signal charges accumulated in the third photodiode PD3 over the saturation charge amount pass through the overflow path 61 formed at the bottom portion of the third gate electrode 53 and are discharged to the third floating diffusion area FD3.

When the first to third transmission gate electrodes 51 to 53 are turned on, the signal charges accumulated in the first to third photodiodes PD1 to PD3 pass through the vicinity of the surface of the semiconductor substrate 30, and are transmitted to the first to third floating diffusion area FD1 to FD3, respectively.

In the solid state imaging device 50 according to the embodiment, spectrum is performed in the depth direction of the semiconductor substrate 30 to acquire signal charges of R, G, and B in the single pixel. In addition, it is possible to obtain the same effect as that of the first embodiment.

In the solid state imaging device according to the first to fourth embodiments described above, the CMOS solid state imaging device has been described by way of example, but the technique may be applied to the backside illumination CCD solid state imaging device. Also in this case, the insulating isolating unit electrically isolating the photoelectric conversion unit is formed by embedding the insulating film in the groove portion formed from the face on the opposite side to the light incident face, and thus it is possible to obtain the same effects as those of the first to fourth embodiments.

In the solid state imaging devices according to the first to fourth embodiments, the backside illumination solid state imaging device has been described, but the technique may be applied to a surface solid state imaging device has a structure in which the signal charges are not overflowed in the substrate direction on the opposite side to the light illumination face side of the semiconductor substrate.

In the solid state imaging devices according to the first to fourth embodiments, generally, n-channel MOS transistors are used, but the p-channel transistors may be used. When the p-channel transistors are used, in the drawings, the conductive type thereof is reversed.

The present disclosure is not limited to the application to the solid state imaging device which detects distribution of incident light quantity of visible light to capture an image, but may be applied to a solid state imaging device which captures an image according to the distribution of incident amount of infrared ray, X-ray, particles, or the like. In the broader sense, the present disclosure may be applied to a general solid state imaging device (physical amount distribution detecting device) such as a fingerprint detecting sensor that detect distribution of the other physical amount such as pressure and capacitance to capture an image.

The present disclosure is not limited to the solid state imaging device that sequentially scans each single pixel in the pixel area for each row to read a pixel signal from each single pixel. The present disclosure may be applied to an X-Y address solid state imaging device that selects an arbitrary pixel for each pixel to read a signal for each pixel from the selected pixel.

The solid state imaging device may be formed as one chip, and may be formed as a module having an image capturing function in which the pixel area and the signal processing unit or the optical system are packed.

The present disclosure is not limited to the application to the solid state imaging device, and may be applied an image capturing device. Herein, the image capturing device is a camera system such as a digital camera and a video camera, and an electronic apparatus having an image capturing function such as a mobile phone. The module mounted on the electronic apparatus, that is, a camera module may be provided as the image capturing device.

5. Fifth Embodiment

Electronic Apparatus

Figure 15:
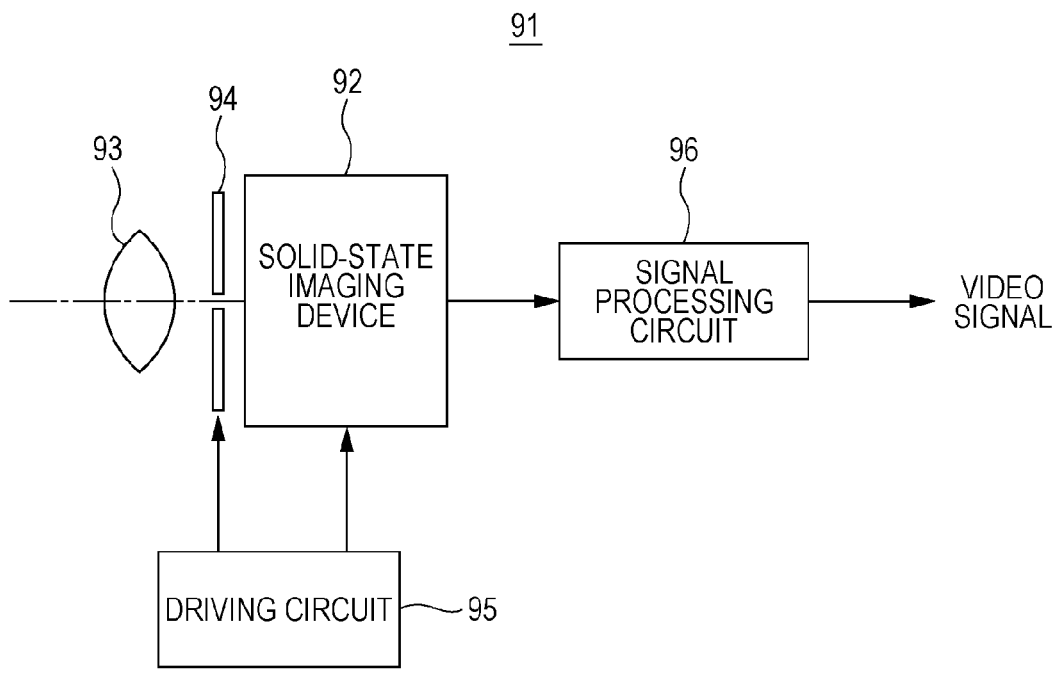
FIG. 15 is a diagram illustrating a schematic configuration of an electronic apparatus according to a fifth embodiment of the present disclosure.

Next, an electronic apparatus according to a fifth embodiment of the present disclosure will be described. FIG. 15 is a diagram illustrating a schematic configuration of an electronic apparatus 91 according to the fifth embodiment of the present disclosure.

The electronic apparatus 91 according to the embodiment includes a solid state imaging device 92, an optical lens 93, a shutter device 94, a driving circuit 95, and a signal processing circuit 96. The electronic apparatus 91 according to the embodiment represents an embodiment when the solid state imaging device 92 and the solid state imaging device 1 in the first embodiment of the present disclosure described above are used in the electronic apparatus (camera).

The optical lens 93 forms an image of image light (incident light) from a photography subject on an imaging face of the solid state imaging device 92. Accordingly, the signal charges are accumulated for a predetermined period in the solid state imaging device 92. The shutter device 94 controls a light illumination period and a light block period of the solid state imaging device 92. The driving circuit 95 supplies a driving signal for controlling a transmission operation of the solid state imaging device 92 and a shutter operation of the shutter device 94. The signal transmission of the solid state imaging device 92 is performed by the driving signal (timing signal) supplied from the driving circuit 95. The signal processing circuit 96 performs various signal processes. Picture signals subjected to the signal process are stored in a storage medium such as a memory or are output to a monitor.

In the electronic apparatus 91 according to the embodiment, blooming is suppressed and saturation characteristics are improved in the solid state imaging device 92, and thus image quality is improved.

The electronic apparatus 91 to which the solid state imaging device 92 may be applied is not limited to the camera, and may be applied to an image capturing device such as a digital camera, and a camera module for a mobile device such as a mobile phone.

In the embodiment, the solid state imaging device 1 in the first embodiment as the solid state imaging device 92 is used in the electronic apparatus, but the solid state imaging devices produced in the second to fourth embodiments described above may be used.

The present disclosure may take the following configuration.

(1)

A solid state imaging device including:
a substrate;
a photoelectric conversion unit that is formed on the substrate to generate and accumulate signal charges according to light quantity of incident light;
a vertical transmission gate electrode that is formed to be embedded in a groove portion formed in a depth direction from one face side of the substrate according to a depth of the photoelectric conversion unit; and
an overflow path that is formed on a bottom portion of the transmission gate to overflow the signal charges accumulated in the photoelectric conversion unit.

(2)

The solid state imaging device according to (1), wherein an area adjacent to the transmission gate electrode is provided with a floating diffusion area in which the signal charges are transmitted from the photoelectric conversion unit, and
wherein the overflow path connects the photoelectric conversion unit to the floating diffusion area.

(3)

The solid state imaging device according to (2), wherein a first conductive or second conductive impurity ion injection area for interface state adjustment is formed around the groove portion in which the transmission gate electrode is formed.

(4)

The solid state imaging device according to (3), wherein a plurality of layers of the photoelectric conversion units are formed in a depth direction of the substrate in the single pixel, and a second conductive semiconductor area that is a charge accumulation area of each photoelectric conversion unit is connected to the overflow path.

(5)

The solid state imaging device according to (3), wherein a plurality of layers of the photoelectric conversion units are formed in a depth direction of the substrate in the single pixel, and a plurality of the transmission gate electrodes are formed corresponding to the photoelectric conversion units.

(6)

A method of producing a solid state imaging device including:
forming a photoelectric conversion unit formed of a photodiode, on a substrate;
forming an overflow path formed of a second conductive semiconductor area in a depth connectable to the second conductive semiconductor area that is a charge accumulation area of the photoelectric conversion unit in an area adjacent to an area of the substrate in which the photoelectric conversion unit is formed;
forming a groove portion at an upper portion of the second conductive semiconductor area that is the overflow path, adjacent to the photoelectric conversion unit;
forming a vertical transmission gate electrode by embedding an electronic material through a gate insulating film in the groove portion; and
forming a floating diffusion area formed of the second conductive semiconductor area and connected to the second conductive semiconductor area that is the overflow path in an area adjacent to the transmission gate electrode.

(7)

The method of producing the solid state imaging device according to (6), wherein in the process before forming the transmission gate electrode in the groove portion, an impurity ion injection area for interface state adjustment formed of a first conductive or second conductive semiconductor area is formed on a side face and a bottom face of the groove portion.

(8)

A method of producing a solid state imaging device including:
forming a photoelectric conversion unit formed of a photodiode, on a substrate;
forming a mask having an opening portion communicating with a desirable area adjacent to an area of the substrate in which the photoelectric conversion unit is formed, on the substrate, and performing etching through the mask to form a groove portion with a desirable depth;
forming a second conductive semiconductor area that is an overflow path in self alignment by ion injection of second conductive impurities through the mask;
forming a vertical transmission gate electrode by embedding an electrode material through a gate insulating film in the groove portion; and
forming a floating diffusion area formed of the second conductive semiconductor area in an area adjacent to the transmission gate electrode to be connected to the overflow path.

(9)

The method of producing the solid state imaging device according to (8), wherein in the process before forming the transmission gate electrode in the groove portion, an impurity ion injection area for interface state adjustment formed of a first conductive or second conductive semiconductor area is formed on a side face and a bottom face of the groove portion.

(10)

An electronic apparatus including:
an optical lens;
a solid state imaging device to which light collected in the optical lens is input; and
a signal processing circuit that processes an output signal of the solid state imaging device,
wherein the solid state imaging device includes a substrate, a photoelectric conversion unit that is formed on the substrate to generate and accumulate signal charges according to light quantity of incident light, a vertical transmission gate electrode that is formed to be embedded in a groove portion formed in a depth direction from one face side of the substrate according to a depth of the photoelectric conversion unit, and an overflow path that is formed on a bottom portion of the transmission gate to overflow the signal charges accumulated in the photoelectric conversion unit.

It should be understood by those skilled in the art that various modifications, combinations, sub-combinations and alterations may occur depending on design requirements and other factors insofar as they are within the scope of the appended claims or the equivalents thereof.

What is claimed is:

1. A method of producing a solid state imaging device comprising:
   forming a photoelectric conversion unit formed of a photodiode, on a substrate;
   forming an overflow path formed of a second conductive semiconductor area in a depth connectable to the second conductive semiconductor area that is a charge accumulation area of the photoelectric conversion unit in an area adjacent to an area of the substrate in which the photoelectric conversion unit is formed;
   forming a groove portion at an upper portion of the second conductive semiconductor area that is the overflow path, adjacent to the photoelectric conversion unit;
   forming a vertical transmission gate electrode by embedding an electronic material through a gate insulating film in the groove portion; and
   forming a floating diffusion area formed of the second conductive semiconductor area and connected to the second conductive semiconductor area that is the overflow path in an area adjacent to the transmission gate electrode.

2. The method of producing the solid state imaging device according to claim 1, wherein in the process before forming the transmission gate electrode in the groove portion, an impurity ion injection area for interface state adjustment formed of a first conductive or second conductive semiconductor area is formed on a side face and a bottom face of the groove portion.

3. A method of producing a solid state imaging device comprising:
   forming a photoelectric conversion unit formed of a photodiode, on a substrate;
   forming a mask having an opening portion communicating with a desirable area adjacent to an area of the substrate in which the photoelectric conversion unit is formed, on the substrate, and performing etching through the mask to form a groove portion with a desirable depth;
   forming a second conductive semiconductor area that is an overflow path in self alignment by ion injection of second conductive impurities through the mask;
   forming a vertical transmission gate electrode by embedding an electrode material through a gate insulating film in the groove portion; and
   forming a floating diffusion area formed of the second conductive semiconductor area in an area adjacent to the transmission gate electrode to be connected to the overflow path.

4. The method of producing the solid state imaging device according to claim 3, wherein in the process before forming the transmission gate electrode in the groove portion, an impurity ion injection area for interface state adjustment formed of a first conductive or second conductive semiconductor area is formed on a side face and a bottom face of the groove portion.

* * * * *